United States Patent
Treude

(10) Patent No.: US 7,767,591 B2
(45) Date of Patent: Aug. 3, 2010

(54) METHOD AND DEVICE FOR PRODUCING ELECTRONIC COMPONENTS

(75) Inventor: Rolf Treude, Erndtebrück (DE)

(73) Assignee: Steiner GmbH & Co. KG, Erndtebruck (DE)

( * ) Notice: Subject to any disclaimer, the term of this patent is extended or adjusted under 35 U.S.C. 154(b) by 75 days.

(21) Appl. No.: 11/918,814

(22) PCT Filed: Apr. 21, 2006

(86) PCT No.: PCT/EP2006/003678

§ 371 (c)(1),
(2), (4) Date: Mar. 21, 2008

(87) PCT Pub. No.: WO2006/111400

PCT Pub. Date: Oct. 26, 2006

(65) Prior Publication Data

US 2009/0068788 A1 Mar. 12, 2009

(30) Foreign Application Priority Data

Apr. 22, 2005 (DE) .................. 10 2005 018 984

(51) Int. Cl.
*H01L 21/31* (2006.01)
(52) U.S. Cl. ............... 438/763; 438/99; 438/502; 438/652; 438/660; 438/761; 257/E21.296; 257/E52.001
(58) Field of Classification Search .......... 438/99, 438/381, 502, 652, 761, 763; 257/E21.296, 257/E51.001; 118/719, 724
See application file for complete search history.

(56) References Cited

U.S. PATENT DOCUMENTS

| 5,097,800 | A | * | 3/1992 | Shaw et al. | ............... 118/730 |
| 5,652,022 | A | * | 7/1997 | Achtner et al. | ............ 427/251 |
| 6,576,523 | B1 | * | 6/2003 | Honda et al. | ............. 438/381 |
| 6,838,153 | B2 | * | 1/2005 | Honda | |
| 6,852,583 | B2 | * | 2/2005 | Bernds | |
| 6,896,938 | B2 | * | 5/2005 | Kastner | |
| 2007/0009766 | A1 | * | 1/2007 | Lu et al. | ............... 428/836.1 |

FOREIGN PATENT DOCUMENTS

| DE | 43 09 717 | * | 9/1994 |
| EP | 1 291 463 | * | 3/2003 |
| WO | 2004/093002 | * | 10/2004 |
| WO | 2004/111729 | * | 12/2004 |
| WO | 2005/043965 | * | 5/2005 |

* cited by examiner

*Primary Examiner*—Julio J Maldonado
*Assistant Examiner*—Wilner Jean Baptiste
(74) *Attorney, Agent, or Firm*—Andrew Wilford

(57) ABSTRACT

The invention relates to a method for producing electronic components in a vacuum. The aim of the invention is to create flexible electronic components that have an optimum action, are cost-effective, and easy to produce in a single working cycle. To this end, a carrier film (12) is partially and/or selectively compressed with a blocking liquid, and is subjected to cathodic sputtering. A metallic layer is deposited on the carrier film (12) in the region free of the blocking layer, and the blocking liquid is evaporated during the evaporation process. A semiconductor agent is applied to the coated carrier film (12) during another evaporation process, and a coating with acrylate is then carried out. The carrier liquid is then partially and/or selectively reapplied to the acrylate layer and a cathodic sputtering is carried out. The cited coating processes are optionally repeated, and connections can be established between the individual metallized layers.

17 Claims, 1 Drawing Sheet

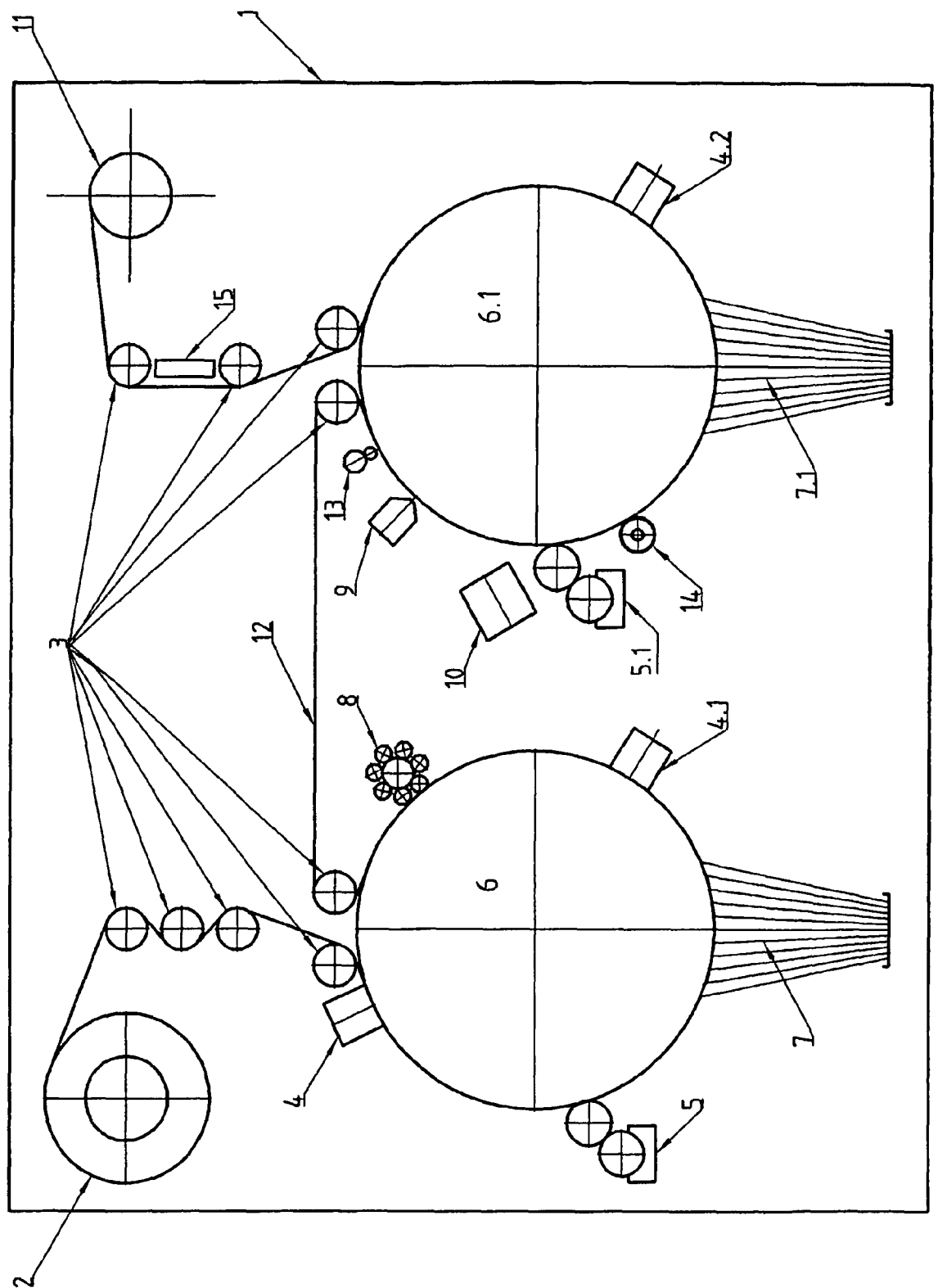

METHOD AND DEVICE FOR PRODUCING ELECTRONIC COMPONENTS

CROSS REFERENCE TO RELATED APPLICATIONS

This application is the US national phase of PCT application PCT/EP2006/003678, filed 21 Apr. 2006, published 26 Oct. 2006 as WO2006/111400, and claiming the priority of German patent application 102005018984.9 itself filed 22 Apr. 2005, whose entire disclosures are herewith incorporated by reference.

FIELD OF THE INVENTION

The invention relates to a method for producing electronic components and to an apparatus for carrying out the method.

BACKGROUND OF THE INVENTION

Methods for metallizing films are known from WO 2002/031214 A1 [U.S. Pat. No. 6,896,938] and EP 1,291,463 A1 where metal layers are partially vapor-deposited in a vacuum onto substrate films. However, it has proven disadvantageous that a washable ink is applied as a barrier liquid and that it must later be washed off outside of the vacuum. In addition, these citations do not disclose any option for producing active components such as field effect transistors.

A method for producing a field effect transistor is also known from DE 100 33 112 A1 [U.S. Pat. No. 6,852,583]. However, in this case printing technologies are used for coating a substrate. The substrate is printed in a normal atmosphere so that the printed layers oxidize extremely easily, and the result is low-quality electronic components.

OBJECT OF THE INVENTION

The underlying object of the invention is to develop a method by means of which electronic components can be produced that are flexible, on the one hand, and on the other hand demonstrate optimum effectiveness, and can be produced in a cost-effective manner and in a single work step.

SUMMARY OF THE INVENTION

For attaining this object, a method is proposed for producing electronic components in a vacuum, where a substrate film is partially printed with a barrier liquid and then is subjected to metal-vapor deposition, whereby a metal layer is deposited on the substrate film in the barrier-layer-free zone and the barrier liquid vaporizes during the vaporization process, and then a semiconductor material is vapor-deposited on the coated substrate film using another vaporization process, and following this a coating with liquid acrylate is effected, and finally following this the barrier liquid is again partially printed onto the acrylate layer, and then metal-vapor deposition is implemented, and the above-described coating steps where necessary are repeated, and connections can be produced between the individual metal layers.

The entire method takes place in a vacuum so that no areas of the applied layers can oxidize. In addition, when coating using metal-vapor deposition, pure metal is deposited on the film. In contrast to printing methods that have a substrate medium for metal particles, there is a significantly higher concentration of metal on the coating areas. The layers can be applied significantly thinner. In addition, it is also possible by using semiconductor material to produce active components such as field effect transistors.

An approach has proven effective in which the film in the vacuum is unwound from a supply roll, and after the appropriate coating processes is wound onto a roll. The least possible introduction of impurities is assured since the entire process takes place in a roll-to-roll method in a vacuum chamber.

It is advantageous that the unrolling and/or rolling-up process is regulated. Because of this, the individual method steps, which may require different time spans, can be matched to one another in the optimum manner.

Advantageously, the vapor pressure and volume of the barrier liquid are selected such that in the subsequent metal coating zone the barrier liquid vaporizes due to the radiant heat of the vaporization source and due to the resulting condensation heat from the substrate film. The metal vapor in these areas is prevented from precipitating because of the vapor layer of the vaporizing barrier liquid on the areas previously wetted with the barrier liquid.

What is attained using this measure is that no cleaning procedures, or almost no cleaning procedures, are needed following the metal coating process.

If up to 95% of the barrier layer in the metal-vapor deposition area evaporates from the substrate film, it is expedient to clean the rest of the barrier layer from the substrate film by means of plasma. However, only the tiniest quantities of the substance to be removed are generated. These small quantities cannot be compared to the cleaning and washing off of the washable ink of prior-art methods.

Using vaporization technology it is possible to obtain extremely small spaces between adjacent metallized areas. However, if particularly small spaces are to be obtained between two adjacent metallized areas, separating a metallized area by scoring by means of microscribing technology is proposed in order to thus attain gaps e.g. <30 µm that can later be filled by the semiconductor material. The width of the semiconductor material between the scribed metallized areas plays a significant role in terms of the speed of the active components that are created here.

It has proven useful to use organic semiconductor material, e.g. pentacene, for the semiconductor material.

In order to separate the individual coating areas from one another and also to be able to assure different time sequences when coating, it has proven advantageous to apply the acrylate in the area of a second cooling roller and to initiate polymerization of the acrylate by means of an electron beam gun. As a result, it is possible to adjust optimum times for the individual coating phases.

It has proven advantageous when the deposited conductors of the first metal coating are used as the drain and source of a field-effect transistor (FET) and the deposited conductor of the second metallized layer is used as a gate. This permits very cost-effective production of a field-effect transistor with the least possible complexity.

However, it is also possible to apply dielectric material in other coating processes. This process enables, for example, capacitors to be produced.

For producing the first or second vapor-deposited metal layers, an approach has also proven successful whereby conductive tracks, resistors, coils, or antennas are co-produced during the same coating stage. Appropriately interconnecting the individual elements enables entire IC's or complete modules such as transponders to be produced.

An approach has proven successful here whereby the connections between the individual metallized layers are constructed as connection channels by means of perforation rollers. The connection channels are filled with conductive metal by a subsequent evaporation process.

It is advantageous if the corresponding coated film is finally plasma-cleaned, function-tested, and also actually rolled up again in the same vacuum. As a result, the corresponding electronic components can be produced and also still tested for their functionality in one vacuum chamber.

BRIEF DESCRIPTION OF THE DRAWING

The invention is described in more detail based on the sole FIGURE of a drawing.

SPECIFIC DESCRIPTION

Here the FIGURE shows a vacuum chamber 1 in which a supply 2 is provided. The substrate film 12 is passed over rollers 3, such as tension-measuring rollers, expander rollers, and guide rollers, to the cooling roller 6. A plasma cleaning apparatus 4 is located in the region of cooling roller 6 to clean the surface of substrate film 12 to be coated. Subsequently, a printing apparatus 5 is provided that applies a barrier liquid partially and selectively applied to the substrate film 12. The substrate film 12 then passes through a coating zone 7 where metal is vaporized and deposited on the substrate film 12 not wetted with barrier liquid. As a result of the radiant heat from the evaporation source and the generated heat of condensation, the barrier liquid is almost completely evaporated from the substrate film 12. Residues remaining on substrate film 12 are removed by a plasma cleaning apparatus 4.1 from the substrate film 12.

The metal vapor-deposition of the substrate film in the vacuum enables even extremely small spacings to be created between adjacent vapor-deposition regions. If the goal is to obtain especially small spacings, these can be produced by an apparatus 8 for microscribing. Subsequent to the microscribing operation, the substrate film 12 passes from cooling roller 6 to a second cooling roller 6.1. Here the substrate film 12 reaches an evaporator tube 13 by means of which semiconductor material is applied to the surface of the partially and selectively coated, and possibly scribed, surface of substrate film 12. Downstream in the travel direction of substrate film 12, the semiconductor coating is effected, an application of acrylate is effected by means of a nozzle 9. The acrylate is impinged upon by electrons from an electron gun 10, thereby polymerizing the acrylate. Subsequently, barrier liquid can be partially and selectively applied by an additional printing apparatus 5.1. Connection channels can be created through the acrylate layer to the underlying metallized layer by a perforation roller 14. The perforation roller produces these channels at the specified spots. Subsequently, the surface of the substrate film is coated. During this operation, the barrier liquid is evaporated, and metal is deposited on the areas not provided with barrier liquid as well as in the channels produced by the perforation roller. Residues from the barrier liquid can be removed by a plasma cleaning apparatus 4.2.

Downstream of this cooling roller, additional cooling rollers can be added, in the region of which printing and coating processes can be implemented, possibly even in modified sequence. Before the substrate film 12 is again rolled up in the roll-up unit 11 also located in vacuum chamber 1, the substrate film 12 passes through a function testing station 15 in which the individually applied electronic components can be function-tested.

The invention claimed is:

1. A method of making electronic components in a vacuum on a substrate film, the method comprising the steps of sequentially:
   printing the film with a barrier liquid;
   depositing a vaporized metal on the printed film so as to coat regions thereof free of the barrier liquid with a first metal layer while evaporating the barrier liquid;
   evaporatively applying a semiconductor material to the metal-coated film;
   coating the film over the semiconductor material with an acrylate;
   polymerizing the acrylate coating;
   printing a barrier liquid on the film over the acrylate coating;
   forming connection channels exposing the first metal layer through the barrier liquid and acrylate coating; and
   depositing a vaporized metal on the coated and printed film so as to form thereon in regions free of the barrier liquid a second metal layer connected at the connection channels with the first metal layer.

2. The method according to claim 1, further comprising the steps of:
   unrolling the substrate film in a vacuum from a supply roll and after the coating process
   winding the substrate film up onto a roll.

3. The method according to claim 1 wherein the unrolling or rolling-up is effected in a regulated manner.

4. The method according to claim 3 wherein the substrate film is passed over rollers a cooling roller, and the metal-vapor deposition is implemented in the region of the cooling roller.

5. The method according to claim 1 wherein vapor pressure and a volume of the barrier liquid is selected such that during the subsequent metal coating zone the barrier liquid is evaporated by radiant heat of the evaporation source and heat generated by condensation from the substrate film, and due to the vapor layer of the evaporating barrier liquid on the areas previously wetted with barrier liquid the metal vapor is prevented from being deposited in these regions.

6. The method according to claim 1 wherein the barrier liquid is evaporated up to approximately 95% during metal coating from the substrate film, and that the substrate film is cleaned by means of plasma to remove the residual barrier liquid.

7. The method according to claim 1 wherein especially small spacings can be created between adjacent metallized regions by scribing the vapor-deposited metal layer by means of the microscribing technique.

8. The method according to claim 1 wherein organic semiconductor material is used as the semiconductor material.

9. The method according to claim 1 wherein the coating is effected with a liquid acrylate in the region of a second cooling roller, and that the acrylate is polymerized by an electron beam gun.

10. The method according to claim 1 wherein vapor-deposited conductive tracks of the first metal layer are used as the drain and source of a field-effect transistor and a vapor-deposited conductive track of the second metallized layer is used as the gate thereof.

11. The method according to claim 1 wherein dielectric material is vapor-deposited in an additional coating processes.

12. The method according to claim 1 wherein the conductive tracks are designed to function as a field-effect transistor, a resistor, a coil, a capacitor, or an antenna.

13. The method according to claim 1 wherein the connections between the individual layers are created as connection channels by means of perforation rollers.

14. The method according to claim 1 wherein the coated substrate film is finally cleaned by plasma, subject to function testing, and wound up in a vacuum.

15. An apparatus for making electronic components on a substrate film, the apparatus comprising:

a vacuum chamber;

a first cooling roller in the chamber around which the film passes in a travel direction;

first printing means adjacent the first roller for printing the film with a barrier liquid;

first coating means adjacent the first roller downstream of the first printing means for depositing a vaporized metal on the printed film so as to form thereon in regions free of the barrier liquid a first metal layer while evaporating the barrier liquid;

microscribing means downstream of the first coating means for forming extremely small spacings between adjacent regions coated with the first metal layer;

a second cooling roller in the chamber around which the film passes after passing around the first cooling roller;

second coating means downstream of the microscribing means and juxtaposed with the second roller for evaporatively applying a semiconductor material to the microscribed metal layer;

third coating means adjacent the second roller and downstream of the second coating means for coating the film over the semiconductor material with an acrylate;

an electron gun downstream of the third coating means for polymerizing the acrylate coating;

second printing means downstream of the electron gun for printing a barrier liquid over the polymerized acrylate;

a perforation roller downstream of the second printing means for forming connection channels exposing the first metal layer through the barrier liquid and acrylate coating; and fourth coating means downstream of the perforation roller for depositing a vaporized metal forming on the polymerized acrylate a second metal layer connected through the channels with the first layer.

16. The apparatus according to claim 15, further comprising apparatuses for plasma cleaning.

17. The apparatus according to claims 16, further comprising a unit for function testing provided upstream of a roll-up unit.

* * * * *